United States Patent
Nagahara et al.

(10) Patent No.: US 7,102,294 B2
(45) Date of Patent: Sep. 5, 2006

(54) FLAT PANEL DISPLAY AND SEMICONDUCTOR DEVICE FOR USE THEREIN

(75) Inventors: Teruaki Nagahara, Tokyo (JP); Fumitaka Tametani, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/965,207

(22) Filed: Oct. 15, 2004

(65) Prior Publication Data

US 2005/0242748 A1   Nov. 3, 2005

(30) Foreign Application Priority Data

Apr. 28, 2004   (JP)   ............................. 2004-134006

(51) Int. Cl.
*G09G 3/10* (2006.01)
(52) U.S. Cl. ................. 315/169.4; 315/169.1; 315/169.3; 345/204
(58) Field of Classification Search ............. 315/169.4
See application file for complete search history.

(56) References Cited

U.S. PATENT DOCUMENTS

| 5,081,400 | A | * | 1/1992 | Weber et al. ............ 315/169.4 |
| 5,604,674 | A | | 2/1997 | Terasawa |
| 6,150,999 | A | * | 11/2000 | Chen et al. .................... 345/60 |
| 6,583,575 | B1 | * | 6/2003 | Roh et al. ................ 315/169.1 |
| 6,657,620 | B1 | * | 12/2003 | Oishi et al. ................. 345/204 |
| 2002/0047577 | A1 | * | 4/2002 | Roh et al. ................ 315/169.3 |
| 2003/0025459 | A1 | * | 2/2003 | Lee et al. ................ 315/169.3 |
| 2004/0046756 | A1 | * | 3/2004 | Kim et al. ................... 345/204 |

FOREIGN PATENT DOCUMENTS

| JP | 8-55956 | 2/1996 |
| JP | 2000-330514 | 11/2000 |

* cited by examiner

*Primary Examiner*—Wilson Lee
*Assistant Examiner*—Binh Van Ho
(74) *Attorney, Agent, or Firm*—Buchanan Ingersoll & Rooney PC

(57) ABSTRACT

A display panel for displaying an image, a drive circuit for driving the display panel and a rear plate for supporting the display panel are provided. The drive circuit includes a circuit board fixed on the rear plate, semiconductor devices surface-mounted on the circuit board to be connected to a plurality of electrodes formed on the display panel and radiator plates attached to the other surfaces of the semiconductor devices opposite to the surfaces mounted on the circuit board so as to be almost in parallel with the rear plate.

4 Claims, 9 Drawing Sheets

F I G. 2
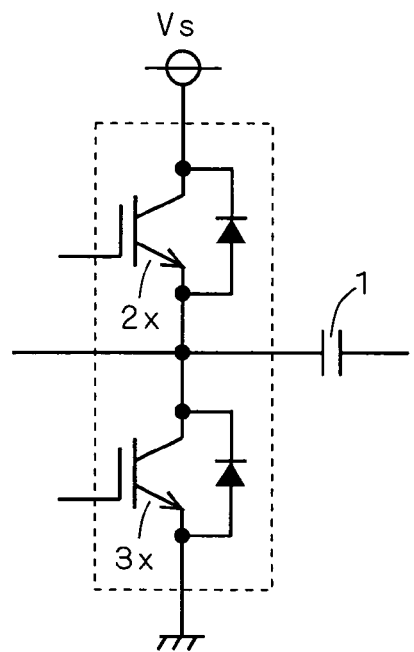
F I G. 3
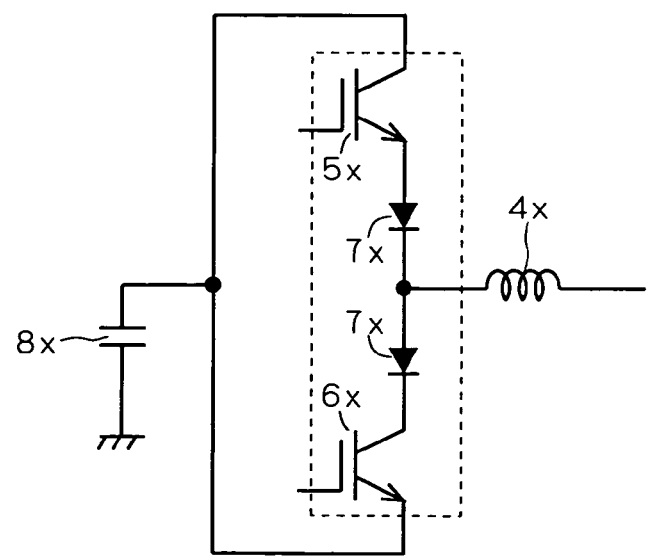

FLAT PANEL DISPLAY AND SEMICONDUCTOR DEVICE FOR USE THEREIN

BACKGROUND OF THE INVENTION

1. Field of the Invention

The present invention relates to a flat panel display and a semiconductor device for use therein, and more particularly, to a flat panel display having a drive circuit mounted thereon and a semiconductor device for use therein.

2. Description of the Background Art

Recently, plasma display panels (hereinafter also referred to as PDPs) are becoming increasingly common as big-screen flat panel displays not only for business use but also for consumer use. A PDP has front and rear glass substrates joined to each other, and a space therebetween is filled with a discharge gas. The glass substrates filled with a discharge gas is called a display panel. A drive circuit including a power device is mounted on the rear side of the display panel. This power device supplies current to the display panel, so that a desired image is displayed on the display panel.

A PDP requires a drive circuit capable of applying a high voltage of not lower than 300V at the maximum and flowing a current of 200 A for an instant. Such drive circuit includes many circuit portions, and one of them called a sustain circuit requires the highest current capacity. Another portion called an energy recovery circuit also requires a high current capacity.

An X electrode and a Y electrode are formed on the display panel in parallel with each other. Current is applied to these electrodes from the sustain circuit, to generate a discharge between the electrodes. In a surface discharge type AC-PDP, electrodes are covered with a dielectric, and therefore, a capacitive load occurs between the X and Y electrodes. Accordingly, in the sustain circuit, an upper switching element for raising voltage to a level necessary for driving the PDP and a lower switching element for reducing voltage to zero are connected constitute a half-bridge circuit. In an actual PDP, other various switching elements and circuits are also provided such that a plurality of levels of voltage and complicate waveforms can be applied for performing a display operation.

Driving a PDP causes charge/discharge of a capacitive load, at which time a very large current flows, which greatly increases losses of switching elements of a sustain circuit. To prevent this and to effectively utilize an electric charge stored in the capacitive load, an energy recovery circuit is provided. The energy recovery circuit temporarily transfers an electric charge stored in the capacitive load to a capacitor provided in the energy recovery circuit to thereby effectively utilize electric power, and reduces current flowing in the switching elements of the sustain circuit to thereby reduce losses by a large amount.

The sustain circuit and energy recovery circuit are each provided with a plurality of switching elements. Usually, field effect transistors (hereinafter also referred to as FETs) are used for these switching elements. Since a PDP is driven at frequencies ranging approximately from 100 kHz to 250 kHz, an FET capable of performing switching at high speeds needs to be adopted as a switching element.

However, since a large current of about 200 A is necessary for an instant for driving a PDP, one FET is not enough to drive the whole PDP in terms of current capacity. Further, to reduce losses of FETs to a realistic value, a plurality of FETs need to be connected in parallel.

An FET has a great advantage over other switching elements for use in driving a PDP in terms of high-speed switching. However, a plurality of FETs need to be connected in parallel in the drive circuit of a PDP since driving of the PDP requires a very large current as described above. The need for a plurality of FETs creates the need for a large circuit board on which the FETs are mounted and the need for large radiator plates (hereinafter also referred to as radiator fins), which is a problem in achieving size reduction and cost reduction of products.

Therefore, attempts are being made to drive a PDP with a smaller number of switching elements instead of FETs. For instance, Japanese Patent Application Laid-Open No. 2000-330514 proposes using an insulated gate bipolar transistor (hereinafter also referred to as IGBT) for the drive circuit of a PDP. An IGBT has advantages over an FET in larger current capacity, lower ON voltage (ON-state resistance) and little variation in ON voltage even with higher device temperatures. The use of IGBT for the drive circuit of a PDP allows a switching element formed by a plurality of FETs connected in parallel to be replaced by one IGBT. Driving a PDP with one IGBT will substantially reduce the number of switching elements, which can reduce a circuit board in area.

The drive circuit of a flat panel display is provided on the rear plate supporting the display panel. Thus, the flat panel display increases in size as the drive circuit increases in size. Particularly, in the case of using FETs in the drive circuit, large radiator fins are required, which increases the drive circuit in size in the direction of thickness of the flat panel display. Since flat panel displays such as PDPs are characterized by small thickness, such large radiator fins cause a serious problem that interferes with the slimming down of flat panel displays.

SUMMARY OF THE INVENTION

It is an object of the present invention to provide a flat panel display having a drive circuit mounted thereon that can be reduced in size and cost, allowing the flat panel display to be reduced in thickness, and to provide a semiconductor device for use in the flat panel display.

According to the present invention, the flat panel display includes a display panel for displaying an image, a drive circuit for driving the display panel and a rear plate for supporting the display panel. The drive circuit includes a circuit board fixed on the rear plate, a semiconductor device surface-mounted at one surface thereof on the circuit board to be connected to a plurality of electrodes formed on the display panel and a radiator plate provided on the other surface of the semiconductor device opposite to the one surface so as to be almost in parallel with the rear plate.

The drive circuit in the flat panel display can be reduced in size and cost. Therefore, the flat panel display can be reduced in thickness.

According to the present invention, the semiconductor device for use in a drive circuit for driving a display panel is surface-mountable at one surface thereof on a circuit board provided on a rear plate supporting the display panel to be connected to a plurality of electrodes formed on the display panel. The semiconductor device allows a radiator plate to be attached to the other surface thereof opposite to the one surface so as to be almost in parallel with the rear plate.

The drive circuit in the flat panel display can be reduced in size and cost. Therefore, the flat panel display can be reduced in thickness.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 is a circuit diagram of a sustain circuit according to a first preferred embodiment of the invention;

FIG. 3 is a circuit diagram of an energy recovery circuit according to the first preferred embodiment;

DESCRIPTION OF THE PREFERRED EMBODIMENTS

First Preferred Embodiment

Figure 1:
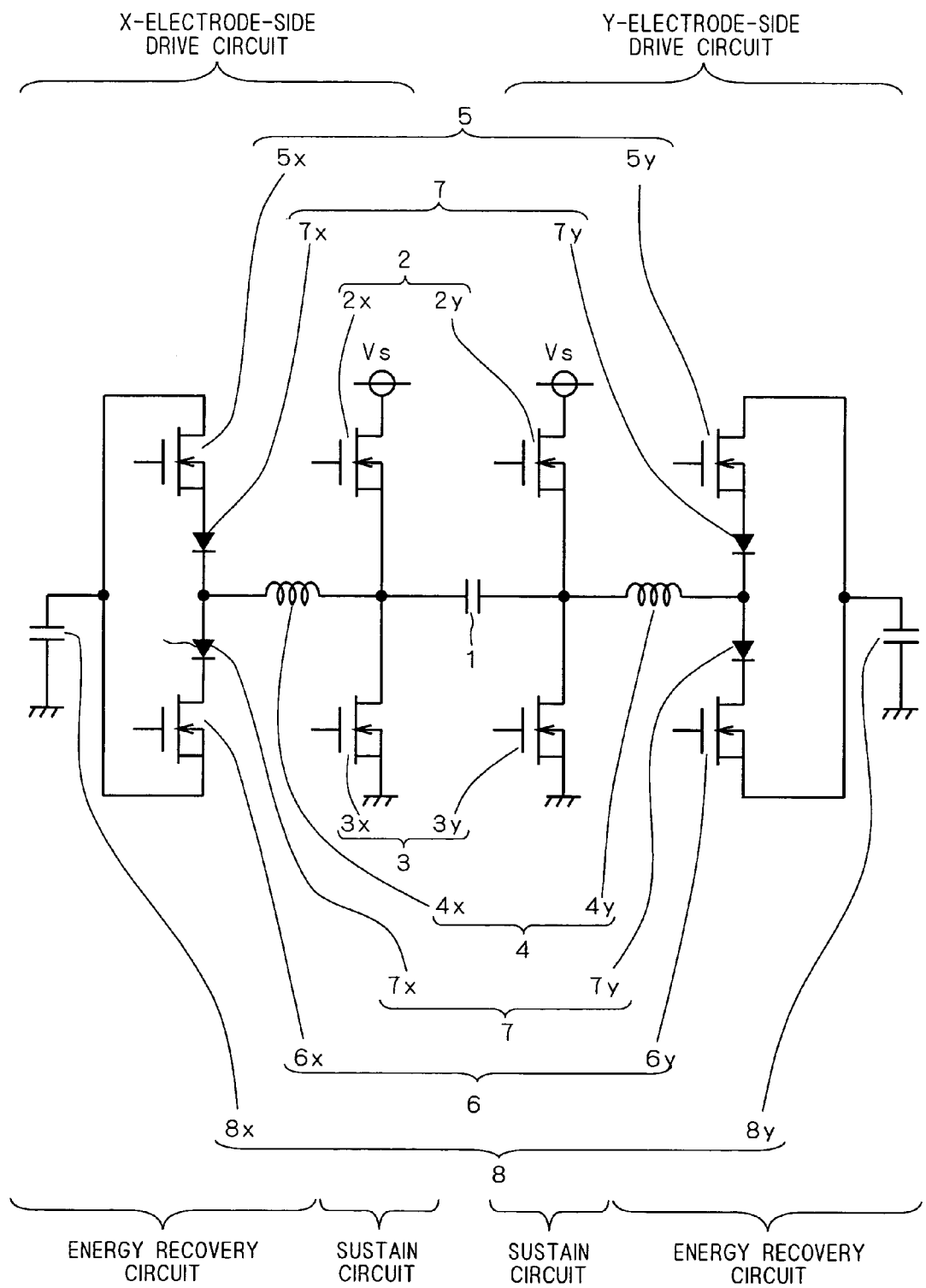
FIG. 1 is a circuit diagram of a drive circuit for driving a display panel according to the present invention.

FIG. 1 is a circuit diagram of a drive circuit of a display panel. Although the present embodiment will discuss a PDP as a flat panel display by way of example, the present invention is not limited as such, but may be applied to a flat panel display having a similar drive circuit (e.g., an inorganic electroluminescent display).

A PDP has an X electrode and a Y electrode formed almost in parallel with each other on a display panel, and current is applied between these X and Y electrodes, to generate a discharge therebetween. Since a dielectric is formed on the X and Y electrodes so as to cover them, a capacitive load occurs between the X and Y electrodes. This capacitive load is schematically indicated as a capacitor 1 in FIG. 1. To drive the display panel, voltage of a necessary level needs to be applied between the X and Y electrodes connected to the respective sides of the capacitor 1. In the circuit shown in FIG. 1, the left part represents the X electrode side, and the right part represents the Y electrode side.

An upper switching element 2x for raising voltage to Vs necessary for driving the display panel and a lower switching element 3x for reducing voltage to zero are connected to each other on the X electrode side of the capacitor 1 to constitute a half-bridge circuit. This forms a part of the drive circuit, and is called a sustain circuit on the X electrode side.

Similarly, an upper switching element 2y for raising voltage to Vs necessary for driving the display panel and a lower switching element 3y for reducing voltage to zero are connected to each other on the Y electrode side of the capacitor 1 to constitute a half-bridge circuit. This forms a part of the drive circuit, and is called a sustain circuit on the Y electrode side.

In FIG. 1, the switching elements 2x and 2y each have one terminal connected to the voltage Vs and the other terminal connected to the capacitor 1. The switching elements 3x and 3y each have one terminal connected to 0V and the other terminal connected to the capacitor 1. In sustain circuits provided in an actual PDP, other various switching elements and circuits are also mounted such that a plurality of levels of voltage and complicate waveforms can be applied for performing a display operation.

The drive circuit shown in FIG. 1 is further provided with energy recovery circuits. The energy recovery circuits are respectively provided on the X electrode side and Y electrode side so that an electric charge stored in the capacitor 1 is effectively utilized. The energy recovery circuit on the X electrode side is formed by a resonance reactor 4x, an upper switching element 5x, a lower switching element 6x, diodes 7x and a capacitor 8x. Similarly, the energy recovery circuit on the Y electrode side is formed by a resonance reactor 4y, an upper switching element 5y, a lower switching element 6y, diodes 7y and a capacitor 8y. The switching elements 2x and 2y may hereinafter generically be called a switching element 2. This also applies to the switching elements 3x and 3y, 4x and 4y, 5x and 5y, 6x and 6y, diodes 7x and 7y, and capacitors 8x and 8i y.

As shown in FIG. 1, the switching elements 5 and 6 each have one terminal connected to the sustain circuit through the diode 7 and resonance reactor 4, and the other terminal connected to the capacitor 8. These energy recovery circuits allow an electric charge stored in the capacitor 1 to be temporarily transferred to the capacitor 8. Accordingly, the drive circuit can effectively utilize electric power and reduce current flowing in the switching elements 2 and 3 in the sustain circuits, to thereby reduce losses by a large amount.

As described, the drive circuit shown in FIG. 1 requires four switching elements 2, 3, 5 and 6 each on the X electrode side and the Y electrode side (eight in total). FIG. 1 illustrates these switching elements as FETs, however, a plurality of FETs need to be connected in parallel in each of these switching elements 2, 3, 5 and 6 in an actual drive circuit since an FET cannot supply a large current as described in the background art. Although FIG. 1 does not show the manner in which FETs are connected in parallel, eight FETs need to be connected in parallel in each of the switching elements 2 and 3, and four FETs need to be connected in parallel in each of the switching elements 5 and 6. The switching elements 2, 3, 5 and 6 each have its gate electrode connected to a driver IC, illustration of which is omitted in FIG. 1.

In the drive circuit according to the present embodiment, an IGBT is used for each of the switching elements 2, 3, 5 and 6 instead of FETs. One IGBT is enough for each of these switching elements 2, 3, 5 and 6. That is, it is not necessary to provide a plurality of IGBTs connected in parallel like FETs.

FIG. 2 shows a circuit diagram of the sustain circuit on the X electrode side according to the present embodiment. In the sustain circuit shown in FIG. 2, the switching elements 2x and 3x shown as FETs in FIG. 1 are each replaced by one IGBT and one free wheeling diode. Similarly, although not shown, the switching elements 2y and 3y in the sustain circuit on the Y electrode side are each replaced by one IGBT and one free wheeling diode.

On the other hand, FIG. 3 shows a circuit diagram of the energy recovery circuit on the X electrode side according to the present embodiment. In the energy recovery circuit shown in FIG. 3, the switching elements 5x and 6x shown as FETs in FIG. 1 are each replaced by one IGBT. Similarly, although not shown, the switching elements 5y and 6y in the energy recovery circuit on the Y electrode side are each replaced by one IGBT.

The sustain circuit shown in FIG. 2 is packaged into one semiconductor device. Specifically, the IGBT and free wheeling diode constituting the switching element 2x and those constituting the switching element 3x surrounded by dotted lines are packaged into one semiconductor device. The same applies to the sustain circuit on the Y electrode side.

Figure 4A:
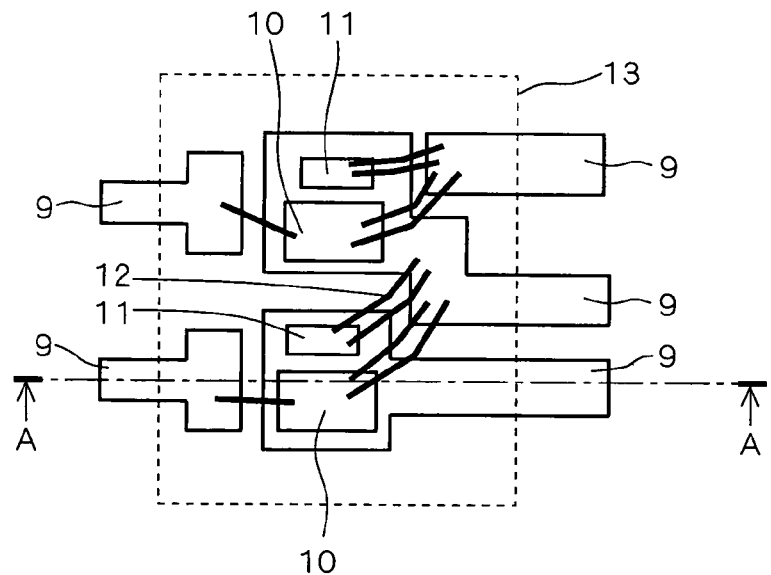
FIGS. 4A to 4C show the configuration of the sustain circuit according to the first preferred embodiment.

FIG. 4A is a plan view of a semiconductor device including the sustain circuit on the X electrode side according to the present embodiment. In FIG. 4A, an IGBT chip 10 and a diode chip 11 are placed on an external lead 9, and are connected to other external leads 9 appropriately with Al wires 12. An IGBT chip 10 and a diode chip 11 shown on the upper side of FIG. 4A correspond to the IGBT and free wheeling diode constituting the switching element 3x, respectively, while an IGBT chip 10 and a diode chip 11 shown on the lower side of FIG. 4A correspond to the IGBT and free wheeling diode constituting the switching element 2x, respectively. The external leads 9, IGBT chips 10, diode chips 11 and Al wires 12 are packaged by a mold resin 13.

Figure 4B:
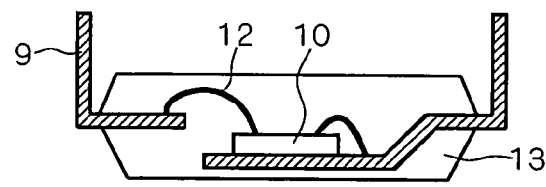
Figure 4C:
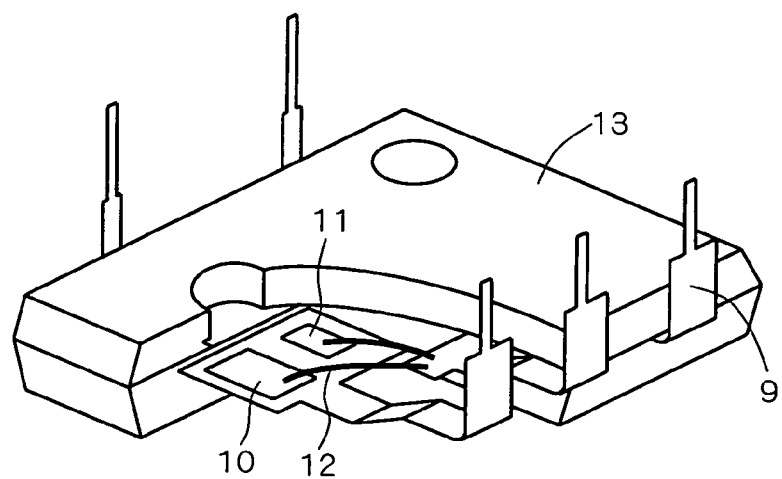

FIG. 4B is a sectional view of the semiconductor device taken along the line A—A of FIG. 4A, and FIG. 4C is a perspective view of the semiconductor device shown in FIG. 4A. As shown in FIGS. 4B and 4C, using one IGBT for each of the switching elements 2x and 3x and packaging the switching elements into one semiconductor device enables size reduction of the sustain circuit.

On the other hand, the energy recovery circuit shown in FIG. 3 is also packaged into one semiconductor device. Specifically, the IGBT constituting the switching element 5x and that constituting the switching element 6x as well as the diodes 7x surrounded by dotted lines are packaged into one semiconductor device. The same applies to the energy recovery circuit on the Y electrode side.

Figure 5:
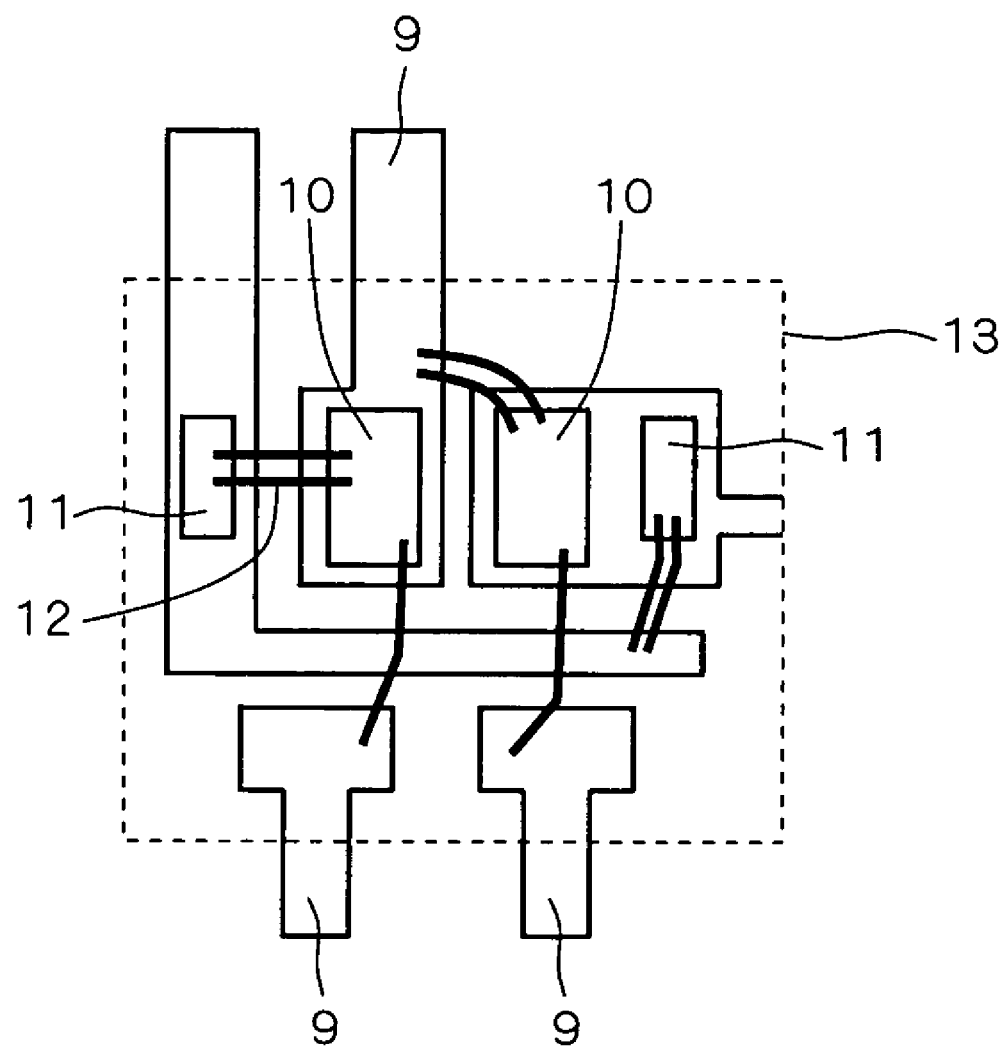
FIG. 5 is a plan view of the energy recovery circuit according to the first preferred embodiment.

FIG. 5 is a plan view of a semiconductor device including the energy recovery circuit on the X electrode side according to the present embodiment. In FIG. 5, an IGBT chip 10 and a diode chip 11 are placed on an external lead 9, and are connected to other external leads 9 appropriately with Al wires 12. An IGBT chip 10 and a diode chip 11 shown on the left side of FIG. 5 correspond to the IGBT constituting the switching element 5x and the diode 7x, respectively, while an IGBT chip 10 and a diode chip 11 shown on the right side of FIG. 5 correspond to the IGBT constituting the switching element 6x and the diode 7x, respectively. The external leads 9, IGBT chips 10, diode chips 11 and Al wires 12 are packaged by a mold resin 13.

Figure 6:
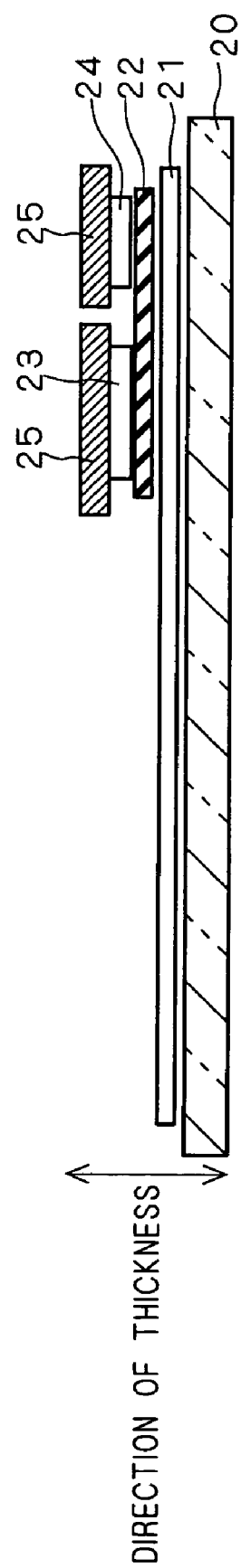
FIG. 6 is a sectional view of a display panel including a drive circuit according to the first preferred embodiment.

FIG. 6 is a sectional view of a display panel including the drive circuit according to the present embodiment. The drive circuit shown in FIG. 6 is provided on a rear plate 21 supporting a display panel 20. The rear plate 21 serves to reinforce the display panel 20 and radiate heat generated by the display panel 20.

The drive circuit is formed by a circuit board 22, a semiconductor device 23 including a sustain circuit, a semiconductor device 24 including an energy recovery circuit and radiator fins 25. A drive circuit provided for an actual PDP is required to exercise complicate control for performing a display operation, and is, therefore, further provided with other various switching elements and circuits. In the drive circuit shown in FIG. 6, the circuit board 22 is fixed on the rear plate 21 at a predetermined position. The semiconductor devices 23 and 24 are mounted on a surface of the circuit board 22 opposite to the surface fixed on the rear plate 21. In the present embodiment, a surface mounting method is adopted for directly soldering the semiconductor devices 23 and 24 onto a surface of the circuit board 22. The semiconductor devices 23 and 24 may constitute one semiconductor device.

The radiator fins 25 are attached to one side surfaces of the semiconductor devices 23 and 24 opposite to the other surfaces mounted on the circuit board 22. The radiator fins 25 are arranged so as to be almost in parallel with the rear plate 21.

The radiator fins 25 are metal plates each having a larger area than either the semiconductor device 23 or 24. A heat-conducting grease may be applied to the junction surface of the semiconductor devices 23, 24 and radiator fins 25 for higher heat conductivity. Although the semiconductor devices 23 and 24 each have a radiator fin 25 formed thereon in the drive circuit shown in FIG. 6, one radiator fin 25 may be provided in common for the semiconductor devices 23 and 24. FIG. 6 only shows the drive circuit on the right side (Y electrode side) of the PDP, but a similar drive circuit exists on the left side (X electrode side).

In the PDP (flat panel display) having the drive circuit mounted thereon as shown in FIG. 6, the semiconductor devices 23 and 24 are surface-mounted, and the radiator fins 25 are arranged almost in parallel with the rear plate 21. Therefore, the drive circuit can be reduced in thickness in the direction of thickness of the flat panel display (in the vertical direction in FIG. 6). A thinner drive circuit allows the slimming down of the flat panel display itself. Further, the use of IGBT for driving the display panel can reduce the circuit board in area to enable reduction in material costs, and can reduce the number of mounting steps. Therefore, manufacturing costs can be reduced.

The drive circuit shown in FIG. 6 is provided with the semiconductor device 23 including the sustain circuit in which IGBTs are connected to constitute a half-bridge circuit and the semiconductor device 24 including the energy recovery circuit in which IGBTs are connected to constitute a half-bridge circuit, and can therefore be reduced in size as compared to the case of using FETs which are discrete components.

The present embodiment has discussed the drive circuit formed by semiconductor devices including IGBTs, however, the present invention is not limited as such, but the drive circuit may be formed by semiconductor devices including components other than IGBTs.

Second Preferred Embodiment

Figure 7:
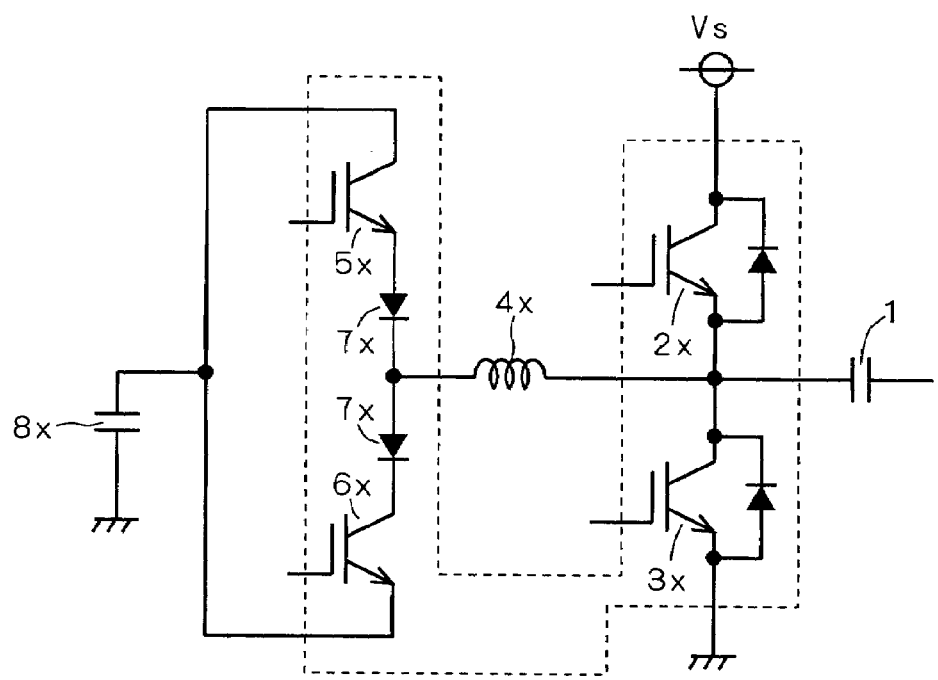
FIG. 7 is a circuit diagram of a drive circuit according to a second preferred embodiment of the invention.

FIG. 7 is a circuit diagram of a drive circuit according to the present embodiment. The circuit diagram shown in FIG. 7 illustrates a drive circuit on the X electrode side connected to the capacitor 1 shown as a replacement for a display panel. The circuit includes a sustain circuit and an energy recovery circuit, similarly to the circuit shown in FIG. 1. In the sustain circuit shown in FIG. 7, an IGBT and a free wheeling diode are used for each of the switching elements 2x and 3x. In the energy recovery circuit shown in FIG. 7, an IGBT is used for each of the switching elements 5x and 6x.

In the present embodiment, a portion (including the switching elements 2x, 3x, 5x, 6x and diode 7x) surrounded by dotted lines is packaged into one semiconductor device. This eliminates the need to separately mount a semiconductor device including the sustain circuit and one including the energy recovery circuit. This also applies to the drive circuit on the Y electrode side.

As described, the flat panel display according to the present embodiment is provided with the drive circuit in which a plurality of half-bridge circuits (sustain circuit and energy recovery circuit) are packaged into one semiconductor device. Therefore, the number of components to be mounted on a circuit board and the number of mounting steps can be reduced, enabling reduction in manufacturing costs.

Third Preferred Embodiment

In the sustain circuit on the X electrode side as shown in FIG. 2, an IGBT and a free wheeling diode are used for each of the switching elements 2x and 3x. Accordingly, the IGBT chips 10 and diode chips 11 are packaged together as shown in FIG. 4A.

In a sustain circuit according to the present embodiment, a reverse conducting IGBT (hereinafter referred to as "RC-IGBT") capable of performing a reverse conduction is used instead of an IGBT. The use of RC-IGBT in the sustain circuit eliminates the need to provide a free wheeling diode, enabling further size reduction of a semiconductor device including such sustain circuit.

Figure 8:
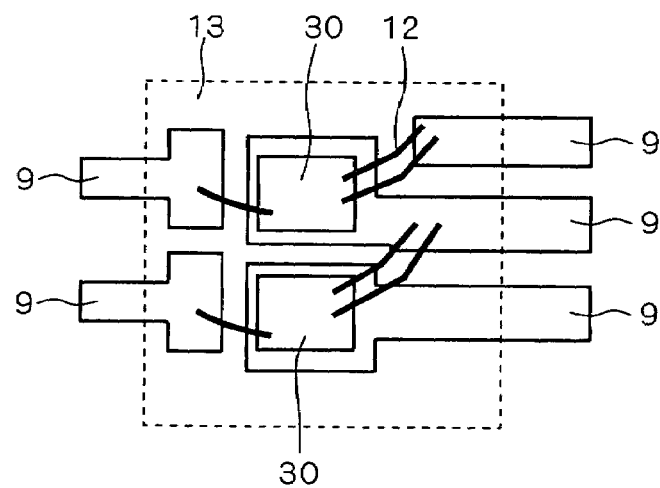
FIG. 8 is a plan view of a sustain circuit according to a third preferred embodiment of the invention.

FIG. 8 is a plan view of a semiconductor device including the sustain circuit according to the present embodiment. In FIG. 8, an RC-IGBT chip 30 is placed on an external lead 9, and is connected to other external leads 9 with Al wires 12 appropriately. The RC-IGBT chip 30 shown on the upper side of FIG. 8 corresponds to the switching element 2, while the RC-IGBT chip 30 shown on the lower side of FIG. 8 corresponds to the switching element 3. The external leads 9, RC-IGBT chips 30 and Al wires 12 are packaged by a mold resin 13.

The energy recovery circuit on the X electrode side as shown in FIG. 3 includes the switching elements 5x and 6x each formed by an IGBT as well as diodes 7x. Accordingly, the IGBT chips 10 and diode chips 11 are packaged together into one semiconductor device as shown in FIG. 5.

In an energy recovery circuit according to the present embodiment, a reverse blocking IGBT (hereinafter referred to as "RB-IGBT") having reverse blocking characteristics is used instead of an IGBT. The use of RB-IGBT in the energy recovery circuit eliminates the need to provide the diode 7, enabling further size reduction of a semiconductor device including such energy recovery circuit.

Figure 9:
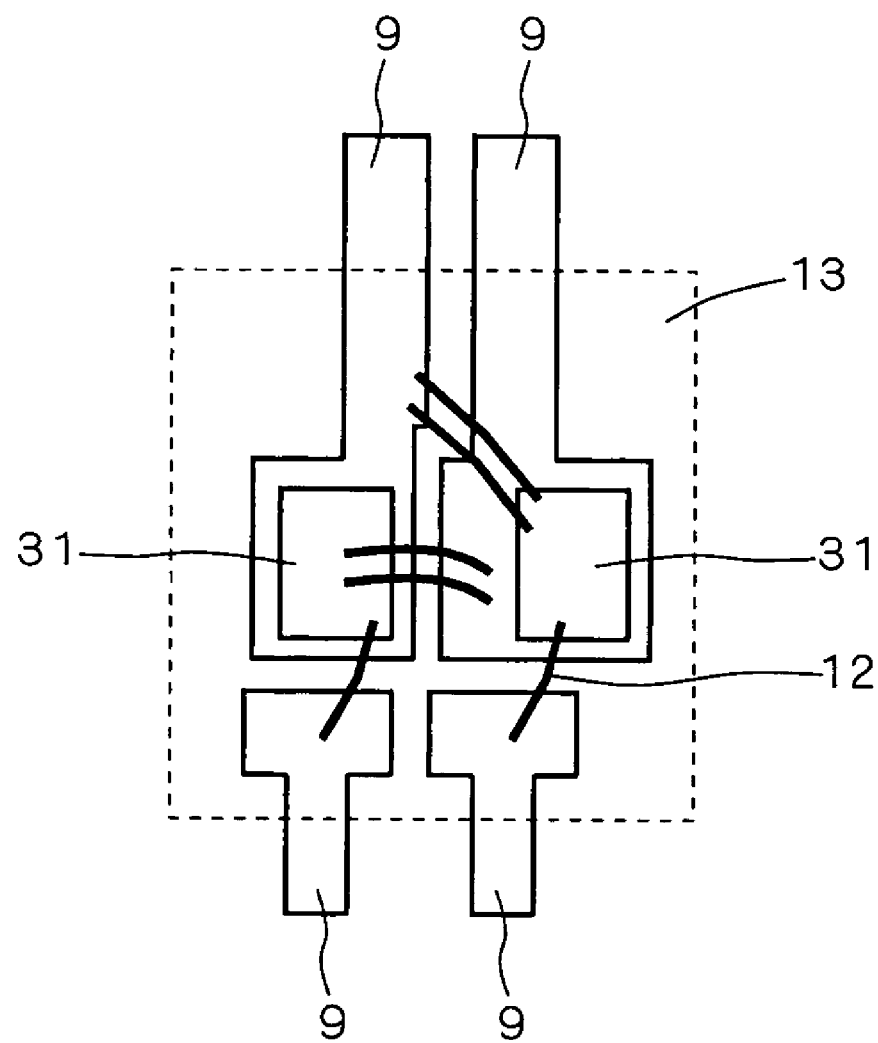
FIG. 9 is a plan view of an energy recovery circuit according to the third preferred embodiment.

FIG. 9 is a plan view of a semiconductor device including the energy recovery circuit according to the present embodiment. In FIG. 9, an RB-IGBT chip 31 is placed on an external lead 9, and is connected to other external leads 9 with Al wires 12 appropriately. An RB-IGBT chip 31 shown on the left side of FIG. 9 corresponds to the switching element 5, while an RB-IGBT chip 31 shown on the right side of FIG. 9 corresponds to the switching element 6. The external leads 9, RB-IGBT chips 31 and Al wires 12 are packaged by a mold resin 13.

As described, according to the flat panel display of the present embodiment, in the drive circuit, the sustain circuit has reverse conducting IGBTs connected to constitute a half-bridge circuit, and the energy recovery circuit has reverse blocking IGBTs connected to constitute a half-bridge circuit. Therefore, it is possible to reduce at least the size of the semiconductor device including the sustain circuit or energy recovery circuit.

Fourth Preferred Embodiment

The switching elements 2 and 3 constituting the sustain circuit are each driven on the basis of a signal supplied to their gate electrodes. A component that supplies a signal to the gate electrodes is called a driver IC, which has conventionally been provided outside a semiconductor device including a sustain circuit.

Figure 10:
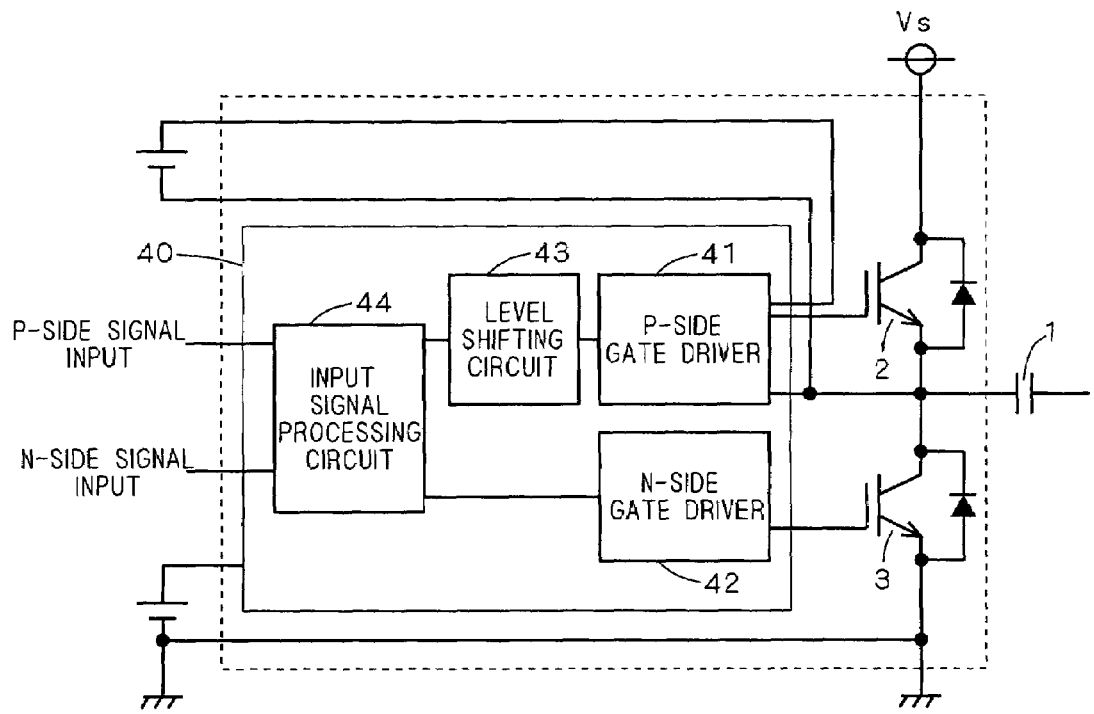
FIG. 10 is a block diagram of a sustain circuit according to a fourth preferred embodiment of the invention.

In the present embodiment, the driver IC is provided inside a semiconductor device including the sustain circuit. FIG. 10 is a block diagram of a semiconductor device including a sustain circuit according to the present embodiment. The semiconductor device shown in FIG. 10 includes the switching elements 2 and 3 constituting the sustain circuit and a driver IC 40. The driver IC 40 is provided with a P-side gate driver 41 connected to the gate electrode of the switching element 2, an N-side gate driver 42 connected to the gate electrode of the switching element 3, a level shifting circuit 43 and an input signal processing circuit 44.

The input signal processing circuit 44 performs a predetermined process on a P-side input signal and an N-side input signal supplied from the outside, and then supplies the signals to the P-side gate driver 41 and N-side gate driver 42, respectively. The level shifting circuit 43 changes the P-side input signal supplied from the input signal processing circuit 44 to a certain level, and then supplies the level-shifted signal to the P-side gate driver 41.

Providing the driver IC 40 for the semiconductor device including the sustain circuit allows interconnect lines for the gate electrodes of the switching elements 2 and 3 to be shortened, preventing the occurrence of malfunctions due to extraneous noise. The portion surrounded by dotted lines in FIG. 10 is packaged into one semiconductor device.

On the other hand, the switching elements 5 and 6 constituting the energy recovery circuit are each driven on the basis of a signal supplied to their gate electrodes. A component that supplies a signal to the gate electrodes is a driver IC, which has conventionally been provided outside a semiconductor device including an energy recovery circuit.

Figure 11:
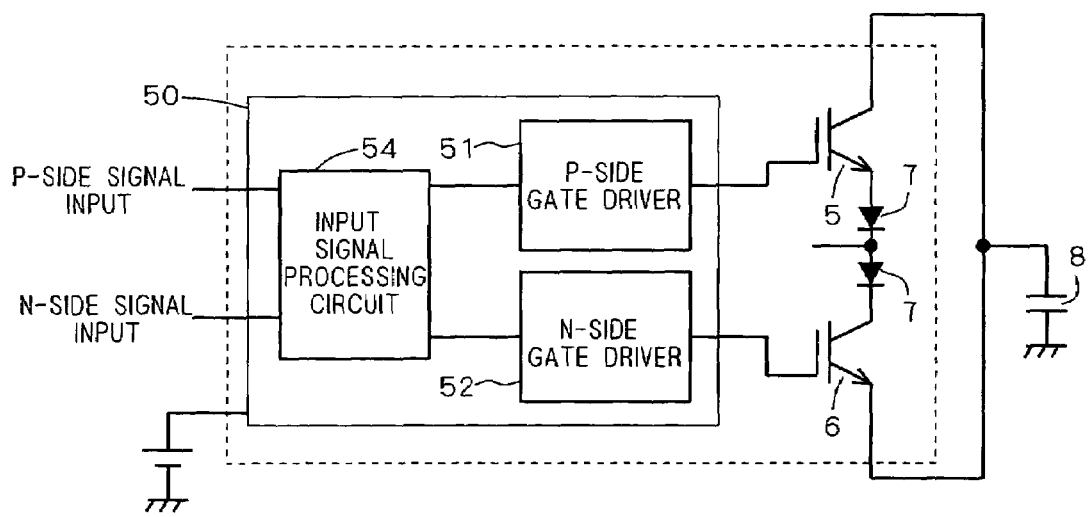
FIG. 11 is a block diagram of an energy recovery circuit according to the fourth preferred embodiment.

In the present embodiment, the driver IC is provided inside a semiconductor device including the energy recovery circuit. FIG. 11 is a block diagram of a semiconductor device including an energy recovery circuit according to the present embodiment. The semiconductor device shown in FIG. 11 includes the switching elements 5 and 6 constituting the energy recovery circuit and a driver IC 50. The driver IC 50 is provided with a P-side gate driver 51 connected to the gate electrode of the switching element 5, an N-side gate driver 52 connected to the gate electrode of the switching element 6 and an input signal processing circuit 54.

The input signal processing circuit 54 performs a predetermined process on a P-side input signal and an N-side input signal supplied from the outside, and then supplies the signals to the P-side gate driver 51 and N-side gate driver 52, respectively. Providing the driver IC 50 for the semiconductor device including the energy recovery circuit allows interconnect lines for the gate electrodes of the switching elements 5 and 6 to be shortened, preventing the occurrence of malfunctions due to extraneous noise. The portion surrounded by dotted lines in FIG. 11 is packaged into one semiconductor device.

Figure 12:
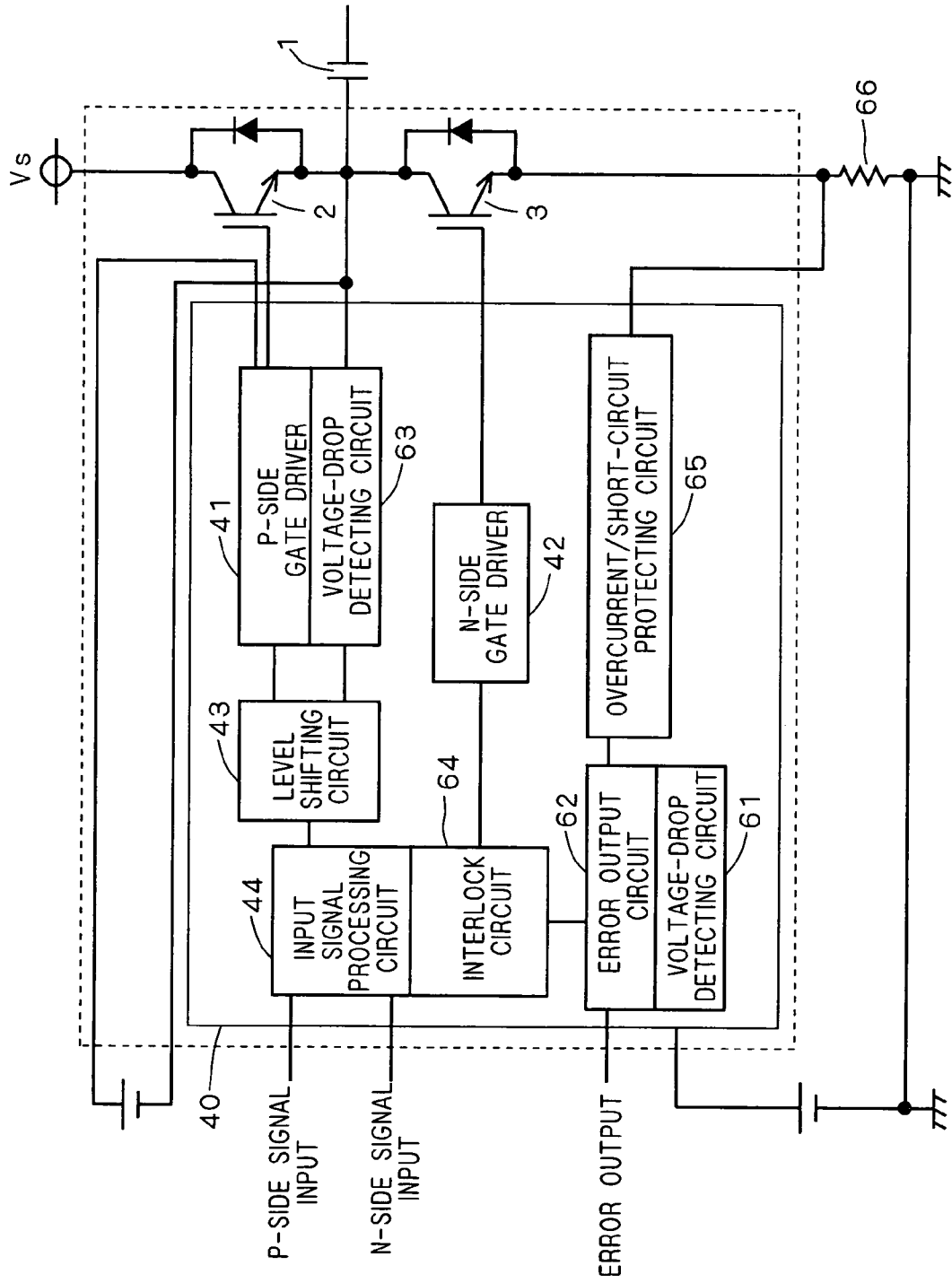
FIG. 12 is a block diagram of another sustain circuit according to the fourth preferred embodiment.

Further, protecting functions may be provided for a semiconductor device including a sustain circuit or energy recovery circuit. More specifically, FIG. 12 shows by way of example a semiconductor device including a sustain circuit provided with protecting functions. The protecting functions added to the semiconductor device shown in FIG. 12 include a supply-voltage-drop detecting function for the driver IC 40, a P-side floating-supply-voltage-drop detecting function, an interlock preventing function and an overcurrent/short-circuit preventing function. The portion surrounded by dotted lines in FIG. 12 is packaged into one semiconductor device.

The supply-voltage-drop detecting function for the driver IC 40 detects a supply voltage drop in the driver IC 40 for preventing an increase in losses due to a gate voltage drop, and makes an error output to the outside. In the semiconductor device shown in FIG. 12, a voltage-drop detecting circuit 61 detects a supply voltage drop in the driver IC 40, and an error output circuit 62 outputs the result of detection to the outside.

The P-side floating-supply-voltage-drop detecting function detects a P-side floating supply voltage drop for preventing an increase in losses due to a gate voltage drop. In the semiconductor device shown in FIG. 12, a voltage-drop detecting circuit 63 detects a P-side floating supply voltage drop.

The interlock preventing function prevents the switching element 2 (P-side) and switching element 3 (N-side) from being brought into an ON state at the same time. In the semiconductor device shown in FIG. 12, an interlock circuit 64 controls the input signal processing circuit 44, to thereby prevent the switching element 2 (P-side) and switching element 3 (N-side) from being brought into an ON state at the same time.

The overcurrent/short-circuit protecting function prevents the semiconductor device from breaking down in the event that an overcurrent or a short-circuit occurs. In the semiconductor device shown in FIG. 12, an overcurrent/short-circuit protecting circuit 65 measures current at a current detecting resistor 66 connected to the emitter of the switching element 3, to thereby prevent the semiconductor device from breaking down in the event that an overcurrent or a short-circuit occurs.

A semiconductor device including an energy recovery circuit may also be provided with the supply-voltage-drop detecting function for a driver IC, the P-side floating-supply-voltage-drop detecting function, the interlock preventing function and the overcurrent/short-circuit preventing function. The protecting functions described above are only illustrative, and other protecting functions may be provided for a semiconductor device including the sustain circuit or energy recovery circuit. Incorporating protecting functions into the semiconductor device brings advantages of the size reduction of the semiconductor device and shortening of interconnect lines over the case of providing the protecting functions individually. Therefore, the semiconductor device can be protected with high accuracy.

As described, in the flat panel display according to the present embodiment, the semiconductor devices included in the drive circuit further include the driver circuits for driving the switching elements 2, 3, 5 and 6 (IGBTs). Therefore, interconnect lines for the gate electrodes of these switching elements 2, 3, 5 and 6 can be shortened, and thus the occurrence of malfunctions due to extraneous noise can be prevented.

While the invention has been shown and described in detail, the foregoing description is in all aspects illustrative and not restrictive. It is therefore understood that numerous modifications and variations can be devised without departing from the scope of the invention.

What is claimed is:

1. Flat panel display comprising: a display panel for displaying an image; a drive circuit for driving said display panel; and a rear plate for directly supporting said display panel, wherein said drive circuit includes: a circuit board fixed on said rear plate; a semiconductor device surface-mounted at one surface thereof on said circuit board to be connected to a plurality of electrodes formed on said display panel; and a radiator plate provided on the other surface of said semiconductor device opposite to said one surface so as to be almost in parallel with said rear plate.

2. The flat panel display according to claim 1, wherein said semiconductor device includes:
   a sustain circuit portion for generating a discharge between said plurality of electrodes, said sustain circuit portion having reverse conducting IGBTs connected to constitute a half-bridge circuit; and
   an energy recovery circuit portion for recovering a discharge between said plurality of electrodes, said energy recovery circuit portion having reverse blocking IGBTs connected to constitute a half-bridge circuit.

3. A semiconductor device for use in a drive circuit for driving a display panel, said semiconductor device being surface-mountable at one surface thereof on a circuit board provided on a rear plate directly supporting said display panel to be connected to a plurality of electrodes formed on said display panel, said semiconductor device allowing a radiator plate to be attached to the other surface thereof opposite to said one surface so as to be almost in parallel with said rear plate.

4. The semiconductor device according to claim 3, comprising:
   a sustain circuit portion for generating a discharge between said plurality of electrodes, said sustain circuit portion having reverse conducting IGBTs connected to constitute a half-bridge circuit; and
   an energy recovery circuit portion for recovering a discharge between said plurality of electrodes, said energy recovery circuit portion having reverse blocking IGBTs connected to constitute a half-bridge circuit.

* * * * *